United States Patent
Chen

(10) Patent No.: US 6,281,089 B1
(45) Date of Patent: Aug. 28, 2001

(54) METHOD FOR FABRICATING AN EMBEDDED FLASH MEMORY CELL

(75) Inventor: Chih Ming Chen, Hsinchu (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/395,188

(22) Filed: Sep. 14, 1999

(51) Int. Cl.$^7$ .................. H01L 21/331; H01L 21/8222
(52) U.S. Cl. .................. 438/315; 438/315; 438/142; 438/257; 438/258; 438/259; 438/297; 438/309; 257/300; 257/301; 257/304; 257/305
(58) Field of Search .................. 438/315, 257–67, 438/225, 297, 142, 309; 257/304–308, 300–303

(56) References Cited

U.S. PATENT DOCUMENTS

| | | | |
|---|---|---|---|
| 5,574,685 | * 11/1996 | Hsu | 365/185.18 |
| 5,668,034 | * 9/1997 | Sery et al. | 438/266 |
| 5,736,764 | * 4/1998 | Chang | 257/318 |
| 5,874,759 | * 2/1999 | Park | 257/314 |
| 5,914,514 | * 6/1999 | Dejenfelt et al. | 257/322 |
| 6,023,085 | * 2/2000 | Fang | 257/315 |
| 6,034,896 | * 3/2000 | Ranaweera et al. | 365/185.28 |
| 6,046,085 | * 4/2000 | Chan | 438/257 |
| 6,074,915 | * 8/1998 | Chen et al. | 438/258 |
| 6,117,756 | * 6/1999 | Wu | 438/594 |

OTHER PUBLICATIONS

Shirai et al. "a 0.54 micron Self–aligned HSG gate cell for Flash Memories" IEEE 1995 IEDM 95–653(0–7803–2700–4).*

C. Contiero et al. "LDMOS implant in 0.6 micron Flash memories" IEEE 1996 (0–7803–3106–0).*

* cited by examiner

Primary Examiner—Matthew Smith
Assistant Examiner—Granville D Lee

(57) ABSTRACT

A method for embedded flash cell fabrication beyond 0.35 Ξm generation. First, a relatively thick field oxide layer is formed on the P-type substrate to separate the flash cell areas and logic cell area. The flash cell areas are divided into tunnel oxide window and capacitor coupling area. Next, a conventional photolithogrpahy and etching method is used to formed a patterned photoresist on the substrate and expose flash cell areas. Then N-type conductive dopants are implanted into the substrate. For 0.35 μm generation, the concentration of dopant is increased to 5E17~1E19 atoms/cm$^3$. Next, the patterned photoresist layer are removed and thicker tunnel oxide and thinner gate oxide layer are formed in one processing step. Next, a doped polysilicon layer is deposited by using a conventional chemical vapor deposition over the tunnel oxide layer to serve as the floating gate of the flash cell.

18 Claims, 2 Drawing Sheets

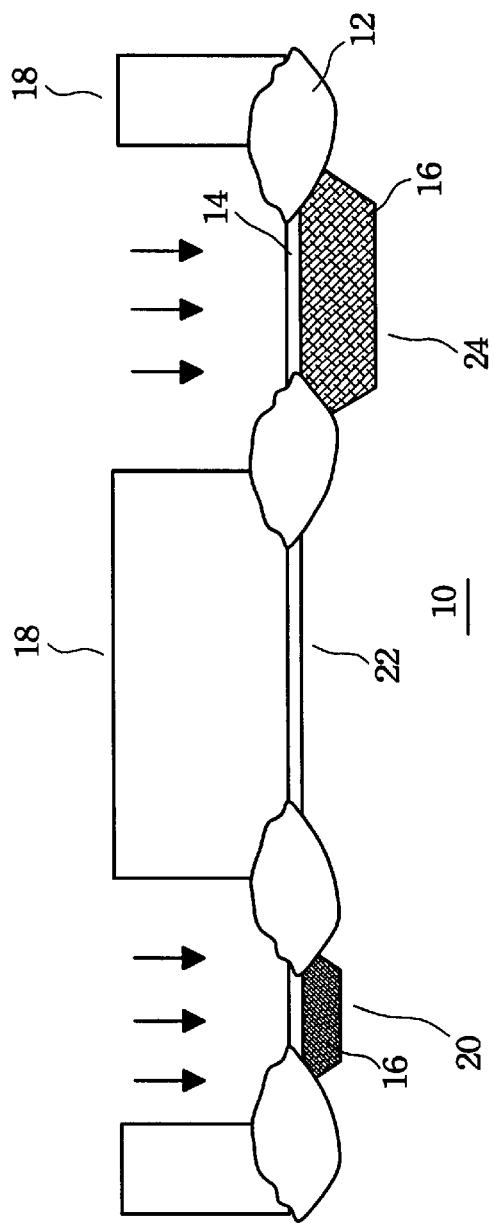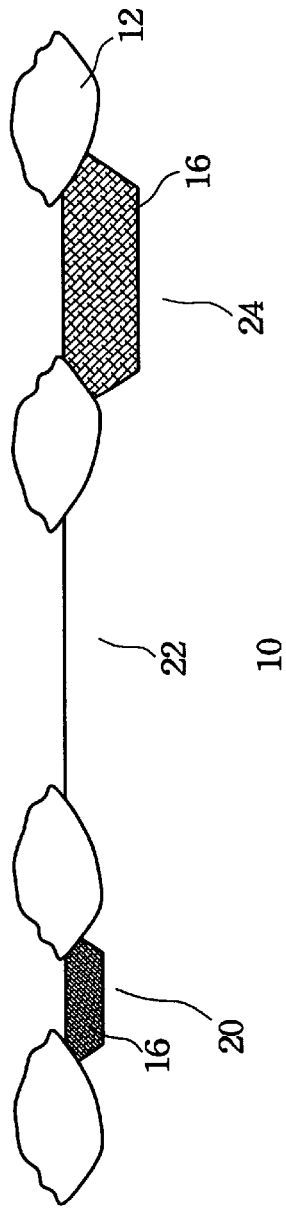

METHOD FOR FABRICATING AN EMBEDDED FLASH MEMORY CELL

FIELD OF THE INVENTION

The present invention relates generally to the fabrication of flash memory devices and more particularly to an embedded flash memory without composite tunnel oxide layer.

BACKGROUND OF THE INVENTION

Memory technology has progressed considerably in recent years. Since the operational speed and the manipulation data amount of a central processing unit (CPU) is increasing, the performance of a memory cell is increasing at the same time. For example, high speed erasing is a popular method for improving the performance of a memory. Volatile storage memories such as random access memory (RAM) is widely used in computer nowadays. But the stored data vanishes due to the power break off. Another nonvolatile storage memories such as mask read only memory (Mask ROM), erasable programmable ROM (EPROM), or electrically erasable programmable ROM (EEPROM) will not lost the stored messages when lack of power and will be better for some specific usage.

Flash memories are also a nonvolatile storage memory with similar structure as EEPROMs. They have a very high speed erasing feature in either an overall region or a local region thereof, therefore they are very popular in the computer field also. For example, they are used to replace the read-only memories to store the firmware such as BIOS (basic input/output system). The users can easily update their BIOS by rewriting the flash memory.

Conventional flash memory cells have a double or triple layer of polysilicon structure. The upper most polysilicon layer is patterned to form the control gates and the word lines of the structure, and the second polysilicon layer is patterned to form the floating gates as a double layer structure. A third polysilicon layer is patterned as select gates to form the triple layer polysilicon structure. No matter what the structures of the flash memories are, the characteristic of tunnel oxide layer between the substrate and the floating gate is a key factor for the operation of flash memories.

Although the scale down of devices is the trend for semiconductor fabrication, the flash memories cannot scale down the thickness of tunnel oxide in order to avoid leakage current problem. For example, the thickness of tunnel oxide between about 90 to 100 angstroms will be used in 1.0 $\mu$m generation as well as 0.25 $\mu$m generation.

Alternatively, there are configurations of single-poly flash memories together with logic circuitry. When embedding memory cells into a standard logic process, it is desirable to do so without changing the single-poly process typically used in the fabrication of the logic circuitry. This desire has led to the development of a single-poly flash memory cell having the same N+ source and drain regions formed in a P type substrate. An N diffusion region formed in the P type substrate serves as the control gate and is capacitively coupled to the floating gate via a thin oxide layer. That is, tunnel oxide layer. Since the control gate and floating gate of this singly-poly flash cell form a capacitor in a manner similar to that of the more traditional stacked-gate, double-poly, or triple-poly flash cells, the single-poly flash cell is programmed, erased, and read in a manner similar to that of the conventional flash cell.

Furthermore, when we fabricate the semiconductor devices above 0.5 $\mu$m generation, the thickness of gate oxide layer of the logic cell is thicker than tunnel oxide layer of embedded flash cell. Accordingly, the tunnel oxide layer of embedded flash cell can be grown last together with the gate oxide layer of the logic cell. A high quality tunnel oxide layer can be achieved easily due to one step processing. Nevertheless, when the periphery logic cell is scale down due to cost saving and lower power consumption, the thickness of gate oxide layer can be formed from, for example, about 130 A at 0.5 $\mu$m generation and reduced to about 70 A at 0.35 $\mu$m generation. The typical thickness of the logic gate oxide layer at 0.35 $\mu$m generation is thinner than the normal tunnel oxide layer thickness (between about 90~100 angstroms) and the tunnel oxide last grown would not work. Prior art techniques introduce composite tunnel oxide to solve this problem but it will degrade the quality and cycling performance of tunnel oxide. Another approach is to compromise the periphery circuit performance and use the thicker gate oxide. (e.g. 95 A) To compromise between the logic cell and the flash cell, the standard logic cell library cannot be implemented since it is not a truly embedded flash cell.

SUMMARY OF THE INVENTION

The present invention is directed to the fabrication of single-poly flash memory cell. Due to the disadvantage of fabricating processes when the devices are scaling down for embedded flash memory cell, it is a principal object of the present invention to provide a method for embedded single-poly flash cell fabrication with a high quality tunnel oxide layer when the dimensions of the periphery devices are diminished.

It is another object of the present invention to provide a method for embedded single-poly flash memory cell fabrication with high reliability and cost saving of the devices.

Firstly, a lightly doped P-type substrate with <100> crystallographic orientation is provided. Next, use thermal oxidation to grow a pad oxide layer and a silicon nitride layer on the substrate. After silicon nitride layer etching, a relatively thick field oxide layer is formed and active areas are defined. The active areas are separated into three areas, the first sense area is used for logic cell, the second tunnel oxide window area and the third capacitor coupling area are used for single-poly flash memory.

Subsequently, a conventional photolithography and etching method is used to form a patterned photoresist over the substrate and expose the areas for flash cell, that is, tunnel oxide window and capacitor coupling area. Then, N-type conductive dopants such as arsenic ions and phosphorus ions are used to implant into the substrate. For 0.35 $\mu$m generation, the concentration of dopant is increased to about 5E17~1E19 atoms/cm$^3$. Next, the patterned photoresist layer is removed by dry and wet etching steps. The pad oxide layer is then removed by diluted hydrofluoric acid (HF) solution. Thereafter, dry oxidation of O$_2$ oxidant is used to grow the tunnel oxide and gate oxide simultaneously, then a thicker tunnel oxide layer between about 90~100 angstroms and a thinner gate oxide layer between about 65~75 angstroms are formed due to the dopant effect. Next, a doped polysilicon layer is deposited by using a conventional chemical vapor deposition over the tunnel oxide layer to serve as the floating gate of the flash cell.

With the processing steps of the present invention, the complexity of the embedded flash memory processes will not increase due to the scaling down of the logic cells, therefore cost is not increased and yield is not reduced. Besides, a high quality tunnel oxide layer is maintained.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-section view of the single-poly memory device fabrication in accordance with the present invention in which the active area is defined;

FIG. 2 is a cross-section view of the single-poly memory device fabrication in accordance with the present invention in which the oxide layer is removed;

DETAILED DESCRIPTION OF THE PREFERRED EMBODIMENT

Figure 3:
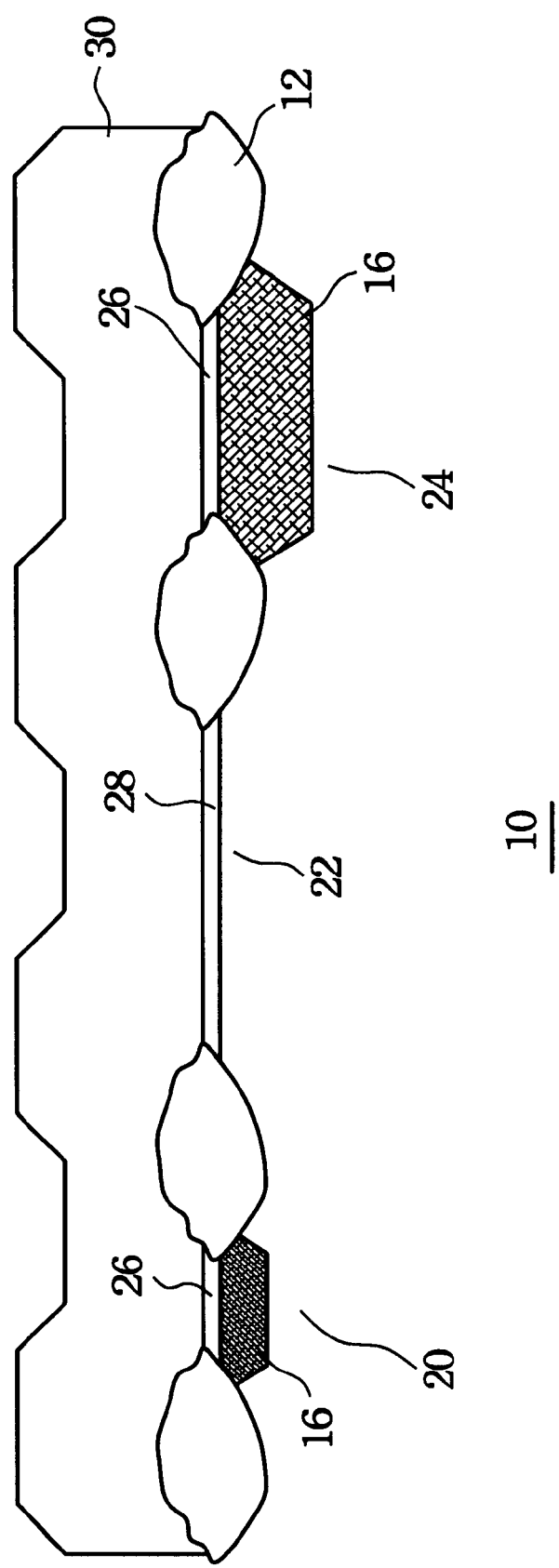
FIG. 3 is a cross-section view of the single-poly memory device fabrication in accordance with the present invention in which polysilicon film is formed.

In light of the above, since for 0.35 μm generation, the thickness of typical logic gate oxide is thinner than the thickness of tunnel oxide, then it is more complicate to fabricate a high quality tunnel oxide of an embedded flash memory cell. The present invention discloses a method for embedded single-poly flash cell fabrication that will not increase the process steps and a high quality tunnel oxide can be achieved in the meantime. The detail descriptions of the present invention are as follows:

Referring to FIG. 1, the figure shows a cross-section view of the present invention. In this figure, a preferred substrate 10 is composed of lightly doped P-type single crystal silicon having a <100> crystallographic orientation. The reason to use a substrate with <100> crystallographic orientation is that the defect density on the surface is lower compare to other crystallographic orientation. It is much easier to produce a better silicon dioxide layer on the surface when we use thermal oxidation to grow gate oxide layer.

Next, a relatively thick field oxide (FOX) 12 is formed surrounding and electrically isolating the individual device regions in which logic cells and embedded memory cells are built. The mostly widely used method for creating isolation in NMOS and PMOS ICs is the basic LOCOS (local oxidation of silicon) structure. In the LOCOS approach, the oxide is selectively grown over the field regions of the IC. This is done by covering the active regions with a thin layer of patterned silicon nitride (not shown in the figure). Silicon oxide layer 14 acts as a pad oxide and is formed by thermal oxidation before the deposition of silicon nitride. When the field oxide 12 is grown, the active regions remain covered by nitride, which prevents oxidation of the underlayer silicon substrate. Generally, the field oxide is grown to a thickness of between about 3000 to 6000 angstroms.

After field oxide regions 12 are formed and silicon nitride are etched away, active regions for logic cells and embedded memory cells are exposed. In FIG. 1, active regions 20 and 24 are for the embedded flash memory cells, and active region 22 (sense area) is for the logic cells. Besides, the oxide layer 14 is not removed and will act as a buffer layer for the subsequent ion implantation.

Next, a conventional photolithography and etching method is used to form a patterned photoresist layer 18 over the substrate 10 and field oxide 12. The patterned photoresist layer 18 is formed to open the active areas 20 and 24, which are the tunnel oxide window and capacitor coupling area respectively.

Subsequently, ion implantation is used to dope with N-type conductive dopants such as arsenic ions and phosphorus ions into tunnel oxide window 20 and capacitor coupling area 24. Ion implantation is able to precisely control the number of implanted dopant atoms into substrate and uniformly distributed. Conventional impurities of the implantation will less than 5E16 atoms/cm$^3$, but the number of implanted dopant atoms in the present invention will increase to about 5E17~1E19 atoms/cm$^3$ in 0.35 μm generation, and even higher as the devices proceed to next generation (beyond 0.35 μm). Thus, N diffusion regions 16 are formed in the P-type substrate 10.

Since memory cells with double polysilicon processing is not otherwise required to manufacture MOS or CMOS logic circuits. Therefore, implementing a double-poly memory cell on current logic manufacturing technologies greatly increases processing complexity, thereby increasing costs and reducing yields. In the present invention, embedded single-poly flash cells are integrated with logic cells. A lot of manufacturing techniques are still developed to reduce costs for the fabrication of embedded memory cells incorporate with logic cells nowadays. From the previous descriptions, the high doping concentration beyond 0.35 μm generation will enhance the subsequent oxide layer grown compare to the undoped silicon substrate area. That is, the thickness of oxide layer can be easily adjusted in accordance with doping concentration.

Referring to FIG. 2 now, after ion implantation, patterned photoresist layer 18 is removed by a conventional dry etching or wet etching method. Subsequently, pad oxide layer 14 also dip out. Wet etching of silicon dioxide (SiO$_2$) films in microelectronic applications is usually accomplished with various hydrofluoric acid (HF) solutions. This is because SiO$_2$ is readily attacked by room temperature HF. Besides, diluted HF is generally used to control the etching rate, and a common etchant formulation contains buffering agents such as ammonium fluoride (NH$_4$F), which help prevent depletion of the fluoride ions, and thus maintain stable etching characteristics.

Referring to FIG. 3, this figure shows a cross-section view of single-poly flash cells according to the present invention. Since memory cell cost can be simply thought of as the product of number of photolithography mask steps required to build the cell times the area of the memory cell. Thus the next process step is to grow the tunnel oxide layer on tunnel oxide window 20 and capacitor coupling area 24 and gate oxide layer on sense area 22 simultaneously. Although there are several ways to produce SiO$_2$ directly on the silicon surface such as low pressure chemical vapor deposition (LPCVD) or plasma enhanced chemical vapor deposition (PECVD), thermal oxidation is capable of producing SiO$_2$ films with superior quality and is normally used to grow tunnel oxides and gate oxides. The oxidation proceeds by the diffusion of an oxidant (molecular H$_2$O or O$_2$) through the existing oxide to the Si/SiO$_2$ interface. It is called wet oxidation for H$_2$O oxidant and dry oxidation for O$_2$ oxidant respectively. The oxidation reaction occurs at the Si/SiO$_2$ interface. Therefore, as the oxide grows, silicon is consumed and the interface moves into the silicon.

In the present invention, Group III and Group V dopants such as boron, phosphorus, arsenic, and antimony can be used to implant and the implanted concentration is raised to about 5E17~1E19 atoms/cm$^3$ in 0.35 μm generation. Next, dry oxidation is used to grow tunnel oxides 26 and gate oxides 28 at one processing step. Due to the high dopant concentration in N diffusion regions 16, the oxidation rate of tunnel oxides 26 will be greater than gate oxides 28. The tunnel oxides 26 are formed to a thickness between about 90~100 angstroms and gate oxide 28 is formed to a thickness between about 65~75 angstroms. Thus the requirement of 0.35 µm devices can be fitted. For the semiconductor devices beyond 0.35 µm generation (e.g. 0.25 µm), a higher dopant concentration is needed to enhance the oxidation rate.

The reason for the dopant effect is that the weakening of the bond structure of the $SiO_2$ occurs as a result of the presence of the large impurities. The weakened bond structure allows $O_2$ molecules to enter more easily, thereby the oxidation growth is enhanced.

Afterwards, a doped polysilicon layer 30 is deposited over the tunnel oxides 26 by using a conventional chemical vapor deposition (CVD) to act as a floating gate of flash cell. In FIG. 3, N diffusion regions 16 are formed in P-type substrate 10 to serve as the control gate and are capacitively coupled to the floating gate 30 via tunnel oxide 26. The flash cell has a bigger capacitor coupling area 24 which programming is accomplished by electron tunneling from the floating gate 30 to the substrate 10, while another portion of the flash cell near the N diffusion region 16 is a smaller tunnel oxide window area 20 that erasing is realized by electron tunneling from the N diffusion region 16 to the floating gate 30.

Furthermore, logic cells are subsequently formed on the sense area 22 after flash memory is accomplished.

From the detail descriptions of this invention, the embedded flash cells in a standard 0.35 µm (and beyond) logic processes can be easily formed without increasing the complexity of the processes. The yield and therefore the cost can be controlled effectively.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for an embedded flash cell fabrication under 0.35 µm generation, said method comprising:

providing a semiconductor substrate;

forming an isolation region on said semiconductor substrate to separate a first active area and a second active area;

doping impurity into said first active area with a concentration more than 5E17 atoms/cm$^3$;

forming a tunnel oxide layer on said first active area and a gate oxide layer on said second active area simultaneously; and forming a conductive layer on said tunnel oxide layer.

2. The method of claim 1, wherein said isolation region is a field oxide layer.

3. The method of claim 1, wherein said impurity consists of arsenic ion and phosphorous ion.

4. The method of claim 1, wherein said forming said tunnel oxide and said gate oxide step use dry oxidation.

5. The method of claim 4, wherein said dry oxidation use oxygen ($O_2$) oxidant.

6. The method of claim 1, wherein said tunnel oxide layer has a thickness between about 90 to 100 angstroms.

7. The method of claim 1, wherein said forming said conductive layer step use chemical vapor deposition (CVD).

8. The method of claim 1, wherein said conductive layer is a doped polysilicon layer.

9. A method for an embedded flash cell fabrication under 0.35 µm generation, said method comprising:

providing a semiconductor substrate;

patterning a pad oxide layer and a silicon nitride layer which are formed sequentially on said semiconductor substrate;

forming an isolation region to separate a first active area and a second active area;

patterning a photoresist on said semiconductor substrate to expose said first active area;

doping impurity into said first active area with a concentration more than 5E17 atoms/cm$^3$;

forming a tunnel oxide layer on said first active area and a gate oxide layer on said second active area simultaneously; and forming a doped polysilicon layer on said tunnel oxide layer.

10. The method of claim 9, wherein said isolation region is a field oxide layer.

11. The method of claim 9, wherein said impurity consists of arsenic ion and phosphorous ion.

12. The method of claim 9, wherein after said doping step further comprises the step of removing said pad oxide.

13. The method of claim 12, wherein said pad oxide is removed by diluted hydrofluoric acid (HF) solution.

14. The method of claim 9, wherein said forming said tunnel oxide and said gate oxide step use dry oxidation.

15. The method of claim 14, wherein said dry oxidation use oxygen ($O_2$) oxidant.

16. The method of claim 9, wherein said tunnel oxide layer has a thickness between about 90 to 100 angstroms.

17. The method of claim 9, wherein said forming said doped polysilicon layer step use chemical vapor deposition (CVD).

18. The method of claim 9, wherein said doped polysilicon layer act as floating gate of said flash cell.

* * * * *